(12) United States Patent
Saggio et al.

(10) Patent No.: US 11,177,394 B2
(45) Date of Patent: Nov. 16, 2021

(54) WIDE BANDGAP SEMICONDUCTOR SWITCHING DEVICE WITH WIDE AREA SCHOTTKY JUNCTION, AND MANUFACTURING PROCESS THEREOF

(71) Applicant: STMICROELECTRONICS S.R.L., Agrate Brianza (IT)

(72) Inventors: Mario Giuseppe Saggio, Aci Bonaccorsi (IT); Simone Rascuna', San Giovanni La Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 16/841,536

(22) Filed: Apr. 6, 2020

(65) Prior Publication Data

US 2020/0235248 A1  Jul. 23, 2020

Related U.S. Application Data

(60) Continuation of application No. 16/357,186, filed on Mar. 18, 2019, now Pat. No. 10,651,319, which is a (Continued)

(30) Foreign Application Priority Data

Aug. 27, 2015 (IT) .................. 102015000046878

(51) Int. Cl.
*H01L 29/872* (2006.01)
*H01L 29/417* (2006.01)
*H01L 29/66* (2006.01)
*H01L 29/06* (2006.01)
*H01L 29/16* (2006.01)
(Continued)

(52) U.S. Cl.
CPC ........ *H01L 29/872* (2013.01); *H01L 21/2253* (2013.01); *H01L 21/76897* (2013.01); *H01L 23/535* (2013.01); *H01L 29/0623* (2013.01); *H01L 29/1608* (2013.01); *H01L 29/417* (2013.01); *H01L 29/6606* (2013.01); *H01L 29/66143* (2013.01); *H01L 29/2003* (2013.01)

(58) Field of Classification Search
CPC .............. H01L 29/1608; H01L 29/872; H01L 29/6606; H01L 29/66143; H01L 29/417; H01L 29/0623; H01L 29/2003; H01L 21/2253; H01L 21/76897
See application file for complete search history.

(56) References Cited

U.S. PATENT DOCUMENTS 6,054,342 A  4/2000 Gossman et al.
6,404,033 B1 * 6/2002 Chang ................ H01L 21/2815
257/484
(Continued)

FOREIGN PATENT DOCUMENTS

JP  2000-101101 A  4/2000

*Primary Examiner* — Vongsavanh Sengdara
(74) *Attorney, Agent, or Firm* — Seed Intellectual Property Law Group LLP

(57) ABSTRACT

A switching device including: a body of semiconductor material, which has a first conductivity type and is delimited by a front surface; a contact layer of a first conductive material, which extends in contact with the front surface; and a plurality of buried regions, which have a second conductivity type and are arranged within the semiconductor body, at a distance from the contact layer.

21 Claims, 6 Drawing Sheets

Related U.S. Application Data division of application No. 15/671,615, filed on Aug. 8, 2017, now Pat. No. 10,276,729, which is a continuation of application No. 15/059,779, filed on Mar. 3, 2016, now Pat. No. 9,748,411.

(51) Int. Cl.
*H01L 21/225* (2006.01)
*H01L 21/768* (2006.01)
*H01L 23/535* (2006.01)
*H01L 29/20* (2006.01)

(56) References Cited

U.S. PATENT DOCUMENTS

| | | | |
|---|---|---|---|
| 6,562,706 B1 | 5/2003 | Liu et al. | |
| 7,064,408 B2* | 6/2006 | Wu | H01L 27/0814 257/471 |
| 8,618,626 B2* | 12/2013 | Chao | H01L 29/872 257/484 |
| 8,766,279 B1* | 7/2014 | Yen | H01L 29/0661 257/77 |
| 2002/0185679 A1 | 12/2002 | Baliga | |
| 2007/0023781 A1 | 2/2007 | Mizukami et al. | |
| 2014/0061671 A1* | 3/2014 | Wada | H01L 29/0623 257/77 |
| 2014/0203299 A1* | 7/2014 | Aketa | H01L 29/08 257/77 |
| 2014/0332882 A1 | 11/2014 | Lui et al. | |
| 2015/0069411 A1 | 3/2015 | Esteve et al. | |
| 2015/0214164 A1* | 7/2015 | Matocha | H01L 21/0485 257/77 |
| 2015/0372093 A1* | 12/2015 | Saggio | H01L 29/0696 257/77 |

* cited by examiner

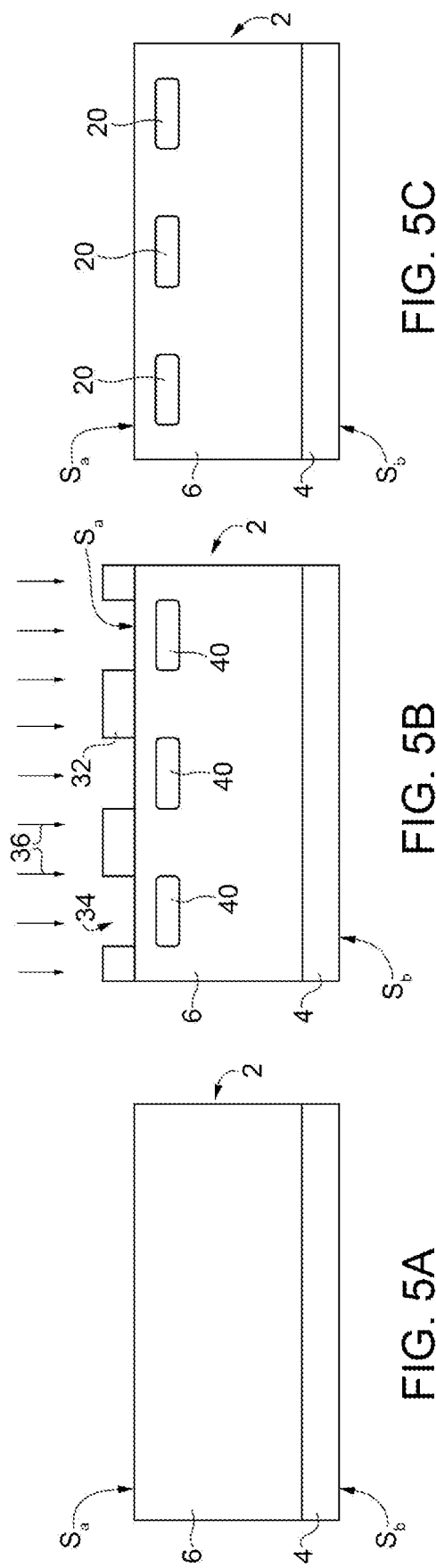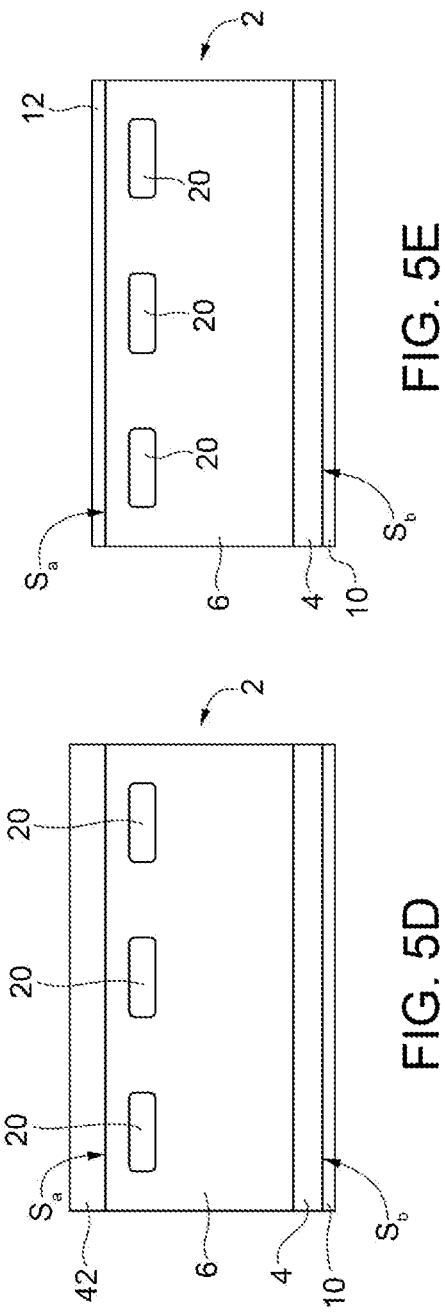

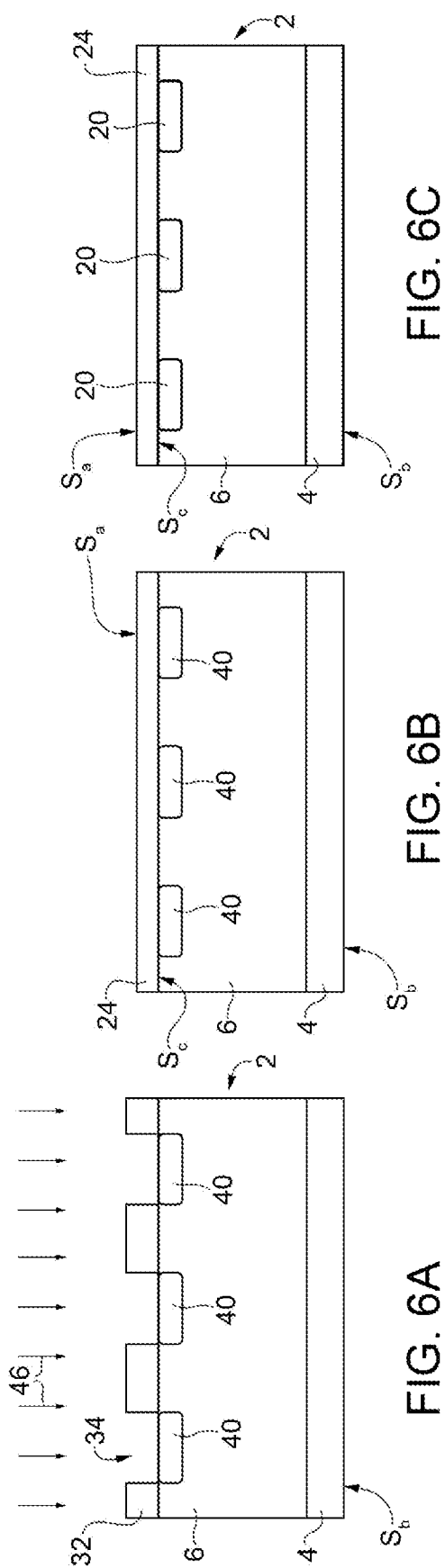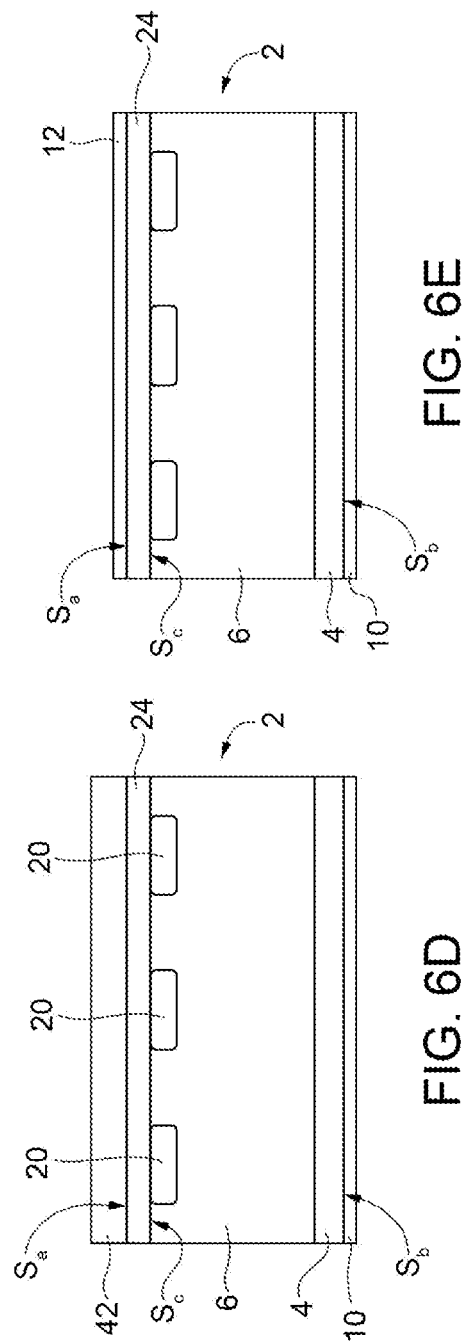

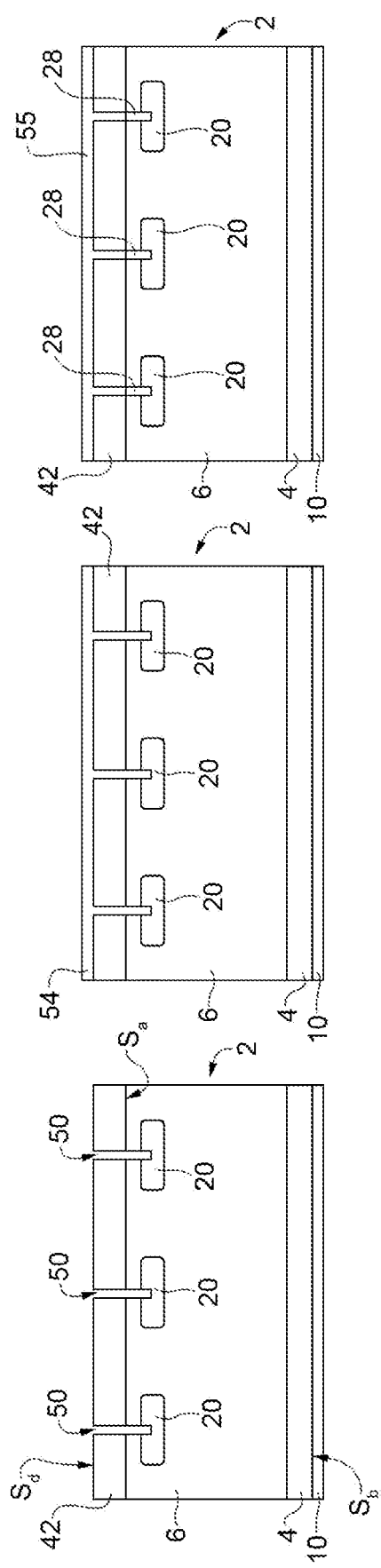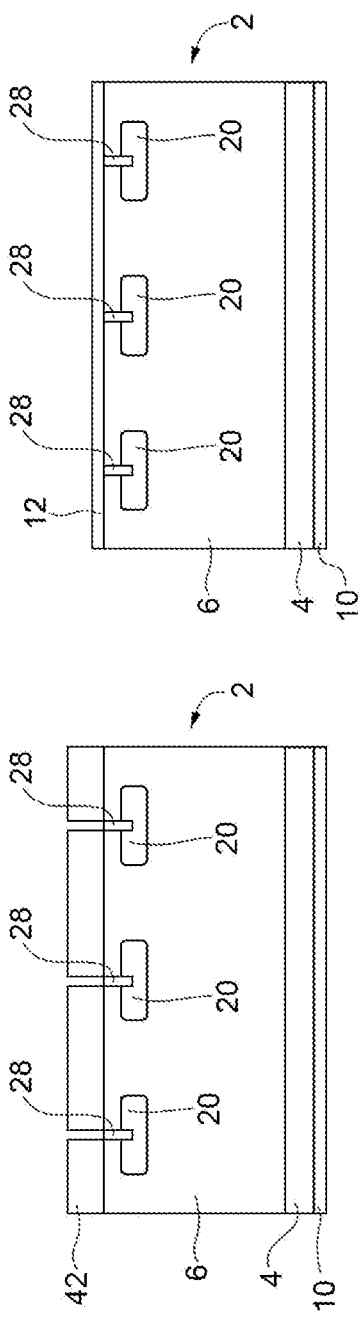

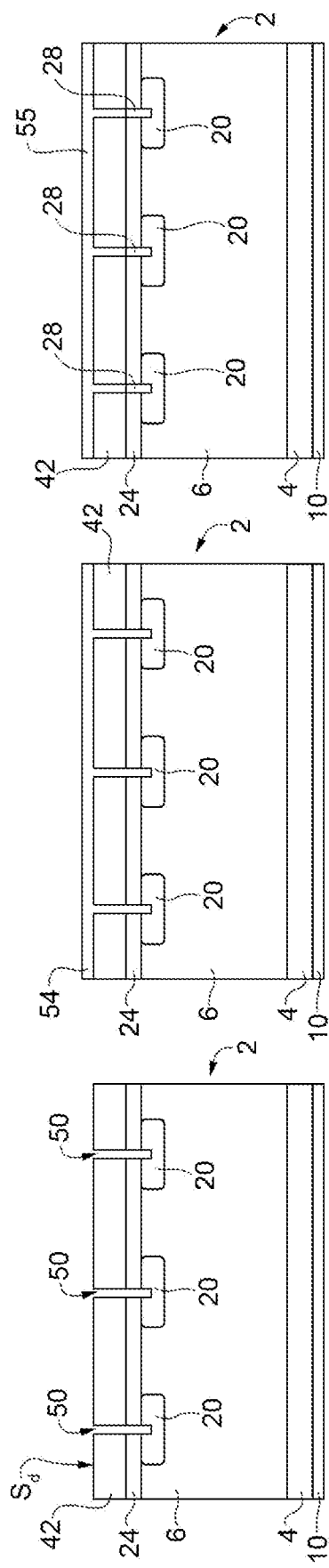
FIG. 8A
FIG. 8B
FIG. 8C
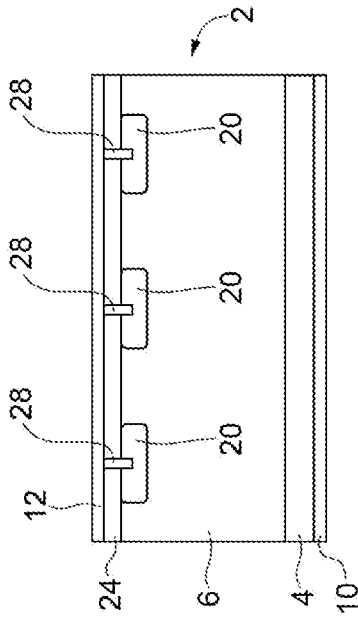
FIG. 8D
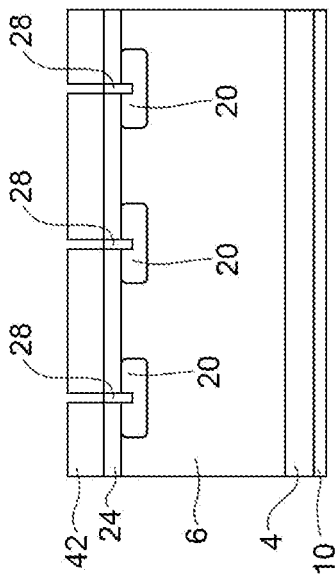
FIG. 8E

WIDE BANDGAP SEMICONDUCTOR SWITCHING DEVICE WITH WIDE AREA SCHOTTKY JUNCTION, AND MANUFACTURING PROCESS THEREOF

BACKGROUND

Technical Field

The present disclosure relates to a wide bandgap semiconductor switching device, which has a wide area Schottky junction; further, the present disclosure relates to the process for manufacturing the aforementioned switching device.

Description of the Related Art

As is known, there are today available so-called "Junction-barrier Schottky" (JBS) power diodes, also known as "Merged PiN Schottky" (MPS) diodes. According to this technology, a diode forms two distinct contacts: an ohmic contact and a Schottky contact.

Generally, JBS diodes are of silicon carbide. In particular, as described, for example, in the U.S. Patent Publication No. 2015/0372093 in the name of the present applicant, a JBS diode includes a semiconductor body of silicon carbide of an N type, which is delimited at the top by a front surface, over which a conductive layer extends, formed, for example, by titanium. Present within the conductive layer, and in contact with the front surface, is a plurality of conductive regions, made, for example, of nickel silicide. Further, formed within the semiconductor body are wells of a P type, which extend from the front surface of the semiconductor body so that each well contacts a corresponding conductive region. In this way, between each conductive region and the corresponding well an ohmic contact is created. In addition, between the conductive layer and the portions of semiconductor body arranged between the wells, corresponding Schottky contacts are formed.

The JBS diodes described above substantially have, at the working current, the same voltage drop as a Schottky diode. Furthermore, in reverse biasing and in the proximity of breakdown, JBS diodes exhibit a leakage current comparable with the leakage current of a bipolar diode. In addition, the presence of the ohmic contact enables JBS diodes to withstand, in forward biasing, high currents, thanks to the fact that the bipolar junction is activated. However, the presence of the ohmic contacts involves the need to align the conductive regions and the corresponding wells precisely. Furthermore, the overall area of ohmic contact is limited by the quality of the alignment. This limit reflects upon the possibility of increasing the density of the wells. In addition, the presence of the wells causes a reduction of the useful area for creation of the Schottky contact, with consequent reduction of the possibility of reducing the voltage drop across the diode, at the working current.

BRIEF SUMMARY

Some embodiments of the present disclosure are a device and a manufacturing process that will overcome at least in part the drawbacks of the known art.

According to one embodiment the present disclosure, a wide bandgap semiconductor switching device includes a body of semiconductor material, which has a first conductivity type and a front surface; a contact layer of a first conductive material, which extends in contact with the front surface; and a plurality of buried regions. The buried regions have a second conductivity type, are arranged within the semiconductor body, and are spaced apart from the front surface, the contact layer, and each other by portions of the body.

One embodiment the present disclosure is a manufacturing process that includes forming, within a body of semiconductor material having a first conductivity type and a front surface, a plurality of buried regions of a second type of conductivity, said buried regions being spaced apart from the front surface and each other by portions of the body; and forming, in contact with the front surface, a contact layer of a first conductive material.

BRIEF DESCRIPTION OF THE SEVERAL VIEWS OF THE DRAWINGS

For a better understanding of the present disclosure preferred embodiments thereof are now described, purely by way of non-limiting example, with reference to the attached drawings, wherein:

FIGS. 5A-5E are schematic cross-sectional views of the embodiment illustrated in FIG. 1, during successive steps of a manufacturing process;

FIGS. 6A-6E are schematic cross-sectional views of the embodiment illustrated in FIG. 2, during successive steps of a manufacturing process;

FIGS. 7A-7E are schematic cross-sectional views of the embodiment illustrated in FIG. 3, during successive steps of a manufacturing process; and FIGS. 8A-8E are schematic cross-sectional views of the embodiment illustrated in FIG. 4, during successive steps of a manufacturing process.

DETAILED DESCRIPTION

Figure 1:
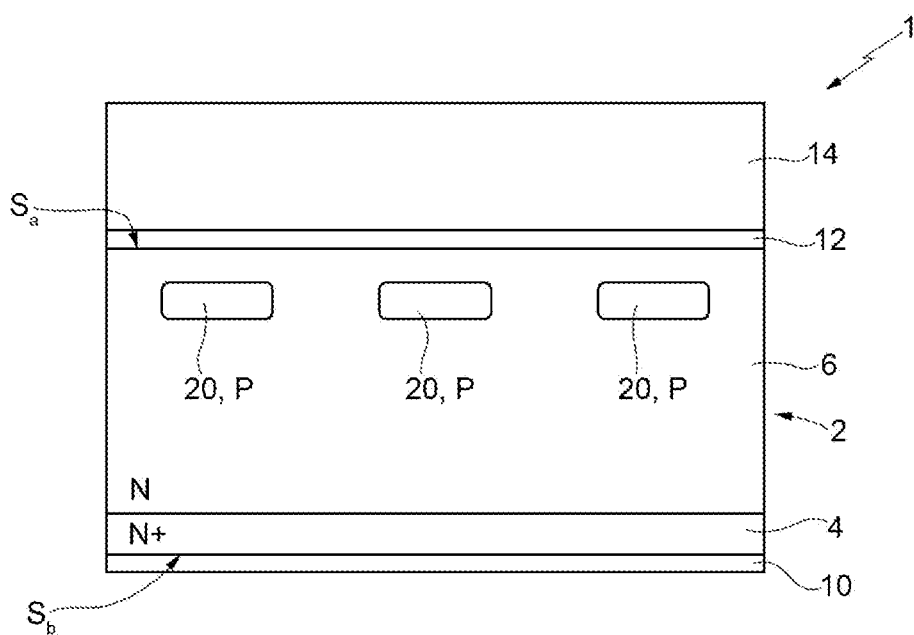
FIGS. 1-4 are schematic cross-sectional views of embodiments of the present switching device.

FIG. 1 is a schematic illustration of the structure of a JBS diode, referred to in what follows as the diode 1.

In detail, the diode 1 comprises a semiconductor body 2, which is made, for example, of a wide bandgap semiconductor, such as for example a material chosen from silicon carbide (SiC), gallium arsenide (GaAs), and gallium nitride (GaN). In what follows, without this implying any loss of generality, it is assumed that the semiconductor body 2 is of silicon carbide.

The semiconductor body 2 comprises a substrate 4 of an N+type and a first epitaxial layer 6 of an N type. The first epitaxial layer 6 is arranged on the substrate 4, with which it is in direct contact, and has a doping level lower than the doping level of the substrate 4. In addition, the semiconductor body 2 is delimited at the top and at the bottom by a first surface $S_a$ and a second surface $S_b$, respectively, which are formed by the first epitaxial layer 6 and by the substrate 4, respectively.

The diode 1 further comprises a bottom contact layer 10, which is made, for example, of nickel silicide and extends underneath the second surface $S_b$, in direct contact with the substrate 4.

The diode further comprises a conductive layer 12 and a top metallization 14.

The conductive layer 12 extends over the first surface $S_a$, in direct contact with the first epitaxial layer 6, and is of a metal, such as for example a material chosen from nickel, titanium, and molybdenum, or any transition metal.

The top metallization 14 extends over the conductive layer 12 and in direct contact with the latter. Furthermore, the top metallization 14 is of a metal material, such as for example aluminum, and has a thickness greater than the thickness of the conductive layer 12. For practical purposes, the top metallization 14 is designed to contact a conductive element, such as for example a so-called "lead", in order to make it possible to inject current into the diode 1 or draw off current therefrom. Consequently, the top metallization 14 is designed to withstand the mechanical stresses induced by contact with the conductive element.

The diode 1 further comprises a plurality of buried regions 20, of the same semiconductor material as that of the semiconductor body 2, which are located at a distance from the first surface $S_a$ and thus do not contact the conductive layer 12.

Without this implying any loss of generality, in the embodiment illustrated in FIG. 1, the buried regions 20 are of a P type and are substantially the same as one another. Further, the buried regions 20 extend to approximately the same depth as the semiconductor body 2.

In greater detail, the buried regions 20 are separated from one another. In addition, in top plan view, the buried regions 20 may for example have an elongated shape (for instance, in a direction parallel to the first surface $S_a$), or else, once again by way of example, a shape chosen from between circular and polygonal. In general, in top plan view, the buried regions 20 may thus define a strip-like or else cell-like arrangement.

In even greater detail, the conductive layer 12 and the first epitaxial layer 6 are such that a so-called Schottky contact is formed between them. In the contact regions between the buried regions 20 and the first epitaxial layer 6 there PN junctions are, instead, formed. In other words, the first epitaxial layer 6 and the buried regions 20 form, respectively, cathode regions and anode regions of bipolar diodes, while the first conductive layer 12 and the first epitaxial layer 6 form, respectively, an anode region and a cathode region of a Schottky diode. In use, the Schottky contact is activated for low biasing voltages of the diode 1, whereas the PN contacts are activated at higher voltages. Furthermore, since the buried regions 20 are separate from the conductive layer 12, the Schottky contact develops over a particularly extensive area.

Figure 2:
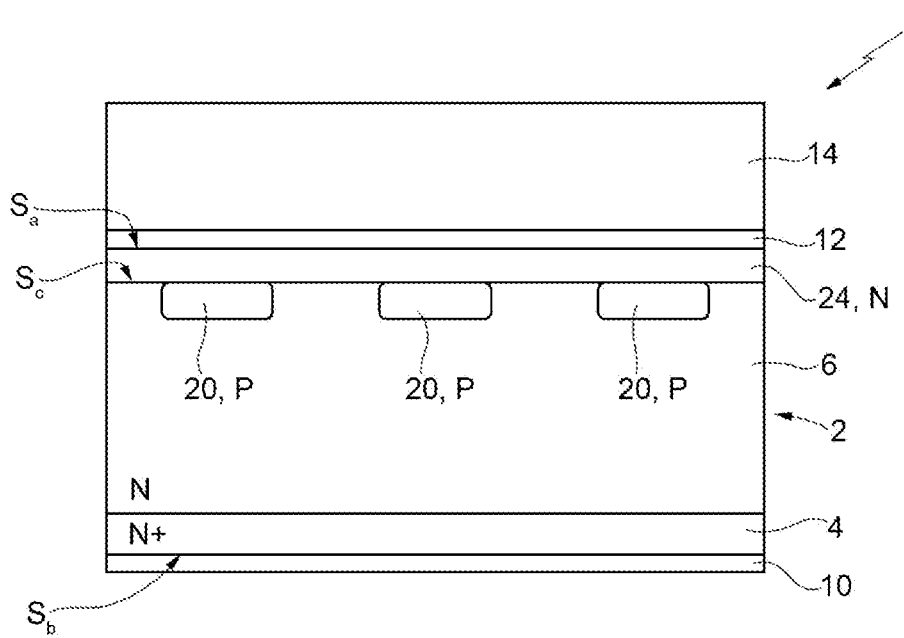

As illustrated in FIG. 2, further possible are embodiments in which the semiconductor body 2 comprises a second epitaxial layer 24, arranged on the first epitaxial layer 6.

For instance, the second epitaxial layer 24 may have approximately the same doping level as the first epitaxial layer 6. In the case where, instead, the first and second epitaxial layers 6, 24 have different doping levels, two degrees of freedom are available for optimizing, in the design stage, the compromise between forward-biasing voltage drop and reverse-biasing leakage current. Furthermore, the second epitaxial layer 24 forms the aforementioned first surface $S_a$ and a third surface $S_c$. In particular, the second epitaxial layer 24 overlies, in direct contact, the buried regions 20, which extend into the first epitaxial layer 6 starting from the third surface $S_c$. In practice, the third surface $S_c$ delimits the first epitaxial layer 6 at the top.

Figure 3:
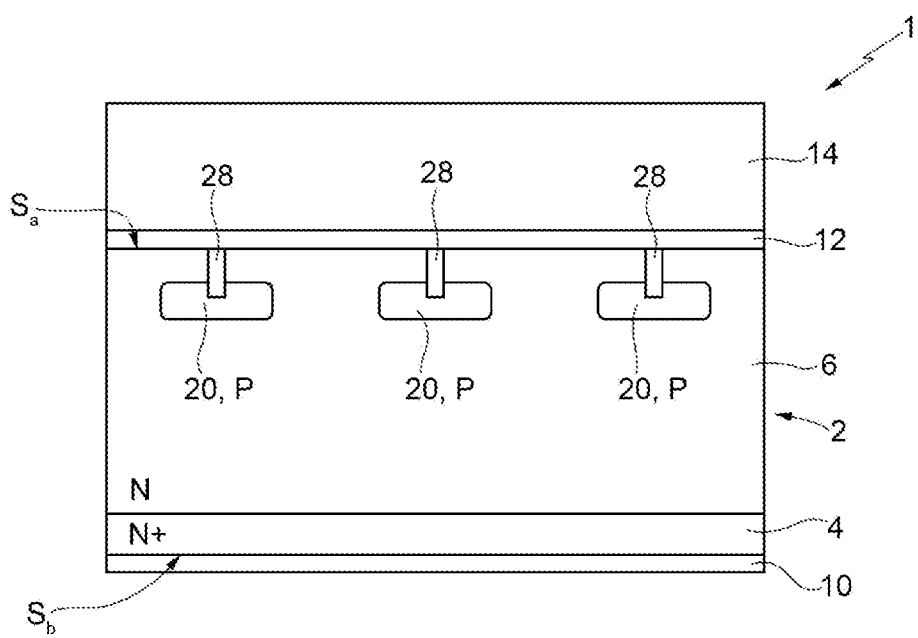

FIG. 3 shows an additional embodiment, in which the diode 1 further comprises a plurality of regions 28, referred to in what follows as the connection regions 28.

In detail, the connection regions 28 are of a conductive material, such as for example nickel silicide, titanium silicide, molybdenum silicide, or a silicide of a transition metal. Furthermore, each connection region 28 extends into the first epitaxial layer 6 starting from the first surface $S_a$ until it contacts a corresponding buried region 20. In addition, as illustrated precisely in FIG. 3, each connection region 28 may extend at least partially into the corresponding buried region 20, and in particular into a top portion of this buried region 20.

In greater detail, the connection regions 28 and the buried regions 20 are such that the area of contact between each connection region 28 and the corresponding buried region 20 forms a corresponding ohmic contact. In this way, the diode 1 is characterized by a particular strength in forward biasing.

Figure 4:
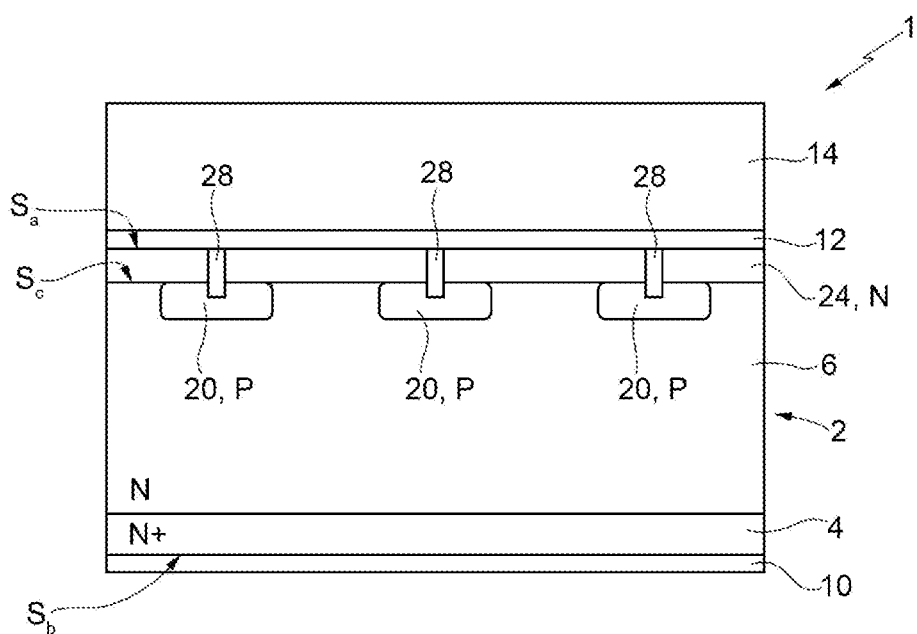

As illustrated in FIG. 4, further possible are embodiments whereby the diode 1 includes both the connection regions 28 and the second epitaxial layer 24. In this case, the connection regions 28 extend through the second epitaxial layer 24. In particular, without this implying any loss of generality, each top region 28 comprises a top portion, which extends from the first surface $S_a$ through the second epitaxial layer 24, and a bottom portion, which extends into the corresponding buried region 20.

The diode 1 illustrated in FIG. 1 can be obtained, for example, as shown in FIGS. 5A-5E and described in detail hereinafter.

Initially, as illustrated FIG. 5A, the semiconductor body 2, formed by the substrate 4 and by the first epitaxial layer 6, is provided.

Next, as shown in FIG. 5B, formed on the first surface $S_a$ is a hard mask 32, which defines a plurality of windows 34. In addition, using the windows 34, an implantation of a P type is carried out, represented schematically by arrows 36, for example of aluminum ions. The implantation is carried out at high energy (for example, higher than 200 keV) and with a dose ranging for example between $1 \cdot 10^{13}$ and $2 \cdot 10^{15}$ atoms/cm². Further, this implantation leads to formation of regions 40 of a buried type, i.e., far from the first surface $S_a$. These regions 40, referred to in what follows as the preliminary regions 40, are to form the buried regions 20.

Next, as shown in FIG. 5C, the hard mask 32 is removed. Furthermore, a thermal process of activation of the implanted ions is carried out. This process is carried out at a temperature higher than 1500° C. Following upon the thermal-activation process, each preliminary region 40 forms a corresponding buried region 20.

Next, as shown in FIG. 5D, deposited on the first surface $S_a$ is a masking layer 42, made, for example, of TEOS oxide. Further, the bottom contact layer 10 is formed underneath the second surface $S_b$ and in direct contact therewith, in a per se known manner and consequently not illustrated. For instance, a bottom layer of metal material (for example, nickel) is formed underneath the second surface $S_b$ and in direct contact therewith, and then a thermal process is carried out, which causes a silicidation of the aforementioned bottom layer of metal material, with consequent formation of the bottom contact layer 10.

Next, as shown in FIG. 5E, the masking layer 42 is removed. In addition, the conductive layer 12 is formed on the first surface $S_a$, for example by sputtering or evaporation.

Finally, in a way not illustrated, the top metallization 14 is formed on the conductive layer 12, for example by sputtering or evaporation.

As regards the embodiment illustrated in FIG. 2, it can be obtained, for example, in the way described hereinafter.

After the operations illustrated in FIG. 5A have been carried out, the hard mask 32 is formed, and an implantation of a P type, represented schematically by arrows 46, is carried out, as shown in FIG. 6A. The implantation is carried out at low energy (for instance, less than 200 keV), for example with aluminum ions, and with a dose ranging, for example, between $1\cdot 10^{13}$ and $2\cdot 10^{15}$ atoms/cm$^2$. Furthermore, this implantation leads to formation of the preliminary regions 40, which give out onto the top surface of the first epitaxial layer 6.

Next, as shown in FIG. 6B, the hard mask 32 is removed, and then a process of epitaxial growth is carried out for forming the second epitaxial layer 24.

Next, as shown in FIG. 6C, a thermal process of activation of the implanted ions is carried out. This process is carried out at a temperature higher than 1500° C. Following upon the thermal-activation process, each preliminary region 40 forms a corresponding buried region 20.

Next, as shown in FIG. 6D, on the second epitaxial layer 24, and thus in contact with the first surface $S_a$ of the semiconductor body 2, the masking layer 42 is deposited. Furthermore, the bottom contact layer 10 is formed underneath the second surface $S_b$ and in direct contact therewith, for example in the way described previously.

Next, as shown in FIG. 6E, the masking layer 42 is removed. Furthermore, the conductive layer 12 is formed on the second epitaxial layer 24, for example by sputtering or evaporation. Next, as described previously, the top metallization 14 is formed.

As regards the embodiment shown in FIG. 3, it can be obtained in the way described hereinafter.

Initially the operations illustrated in FIGS. 5A-5D are carried out.

Next, as shown in FIG. 7A, a plurality of trenches 50 is formed, for example by a dry anisotropic etch. In particular, the trenches 50 are formed by a digging operation that entails selective removal of portions of the masking layer 42 and of the first epitaxial layer 6.

In greater detail, each trench 50 extends from the top surface (designated by $S_d$) of the masking layer 42 and traverses, beyond the masking layer 42, a corresponding portion of the first epitaxial layer 6, arranged between the masking layer 42 and a corresponding buried region 20, until it extends in part into said corresponding buried region 20. In particular, a bottom portion of each trench 50 extends through a top portion of the corresponding buried region 20. Consequently the bottom of each trench 50 extends into the corresponding buried region 20.

Next, as shown in FIG. 7B, formed on the masking layer 42 and within the trenches 50 is a layer 54 of metal material (for example, nickel, titanium or molybdenum), referred to in what follows as the filling layer 54. The filling layer 54 is obtained, for example, by sputtering or evaporation and fills the trenches 50 completely.

Next, as shown in FIG. 7C, a thermal process is carried out at a temperature comprised between 600° C. and 1100° C., and for a duration comprised between 10 and 300 minutes, during which the portions of the filling layer 54 arranged in contact with the semiconductor material undergo a silicidation process, at the end of which they form corresponding connection regions 28. The portion of filling layer 54 that does not undergo any reaction is instead designated by 55 in FIG. 7C.

As shown in FIG. 7D, the non-reacted portion 55 of the filling layer 54 is then removed.

Next, as shown in FIG. 7E, the masking layer 42 is removed; further, the conductive layer 12 is formed on the first epitaxial layer 6. Next, in a way not illustrated, the top metallization 14 is formed.

As regards the embodiment illustrated in FIG. 4, it can be obtained, for example, in the way described hereinafter.

Initially, the operations illustrated in FIGS. 6A-6D are carried out.

Next, as shown in FIG. 8A, the trenches 50 are formed, for example once again by a dry anisotropic etch. In particular, the trenches 50 are formed by a digging operation that involves selective removal of portions of the masking layer 42 and of the second epitaxial layer 24.

In greater detail, each trench 50 extends from the top surface (designated by $S_d$) of the masking layer 42 and traverses, beyond the masking layer 42, a corresponding portion of the second epitaxial layer 24, arranged between the masking layer 42 and a corresponding buried region 20, until it extends in part into said corresponding buried region 20. In particular, a bottom portion of each trench 50 extends through a top portion of the corresponding buried region 20. Consequently the bottom of each trench 50 extends into the corresponding buried region 20.

Next, as shown in FIG. 8B, the filling layer 54 is formed on the masking layer 42 and within the trenches 50.

Next, as shown in FIG. 8C, a thermal process is carried out at a temperature comprised between 600° C. and 1100° C., and for a duration comprised between 10 and 300 minutes, during which the portions of the filling layer 54 arranged in contact with the semiconductor material undergo a silicidation process, at the end of which they form corresponding connection regions 28. The portion of filling layer 54 that does not undergo any reaction is instead designated by 55 in FIG. 8C.

As shown in FIG. 8D, the non-reacted portion 55 of the filling layer 54 is subsequently removed.

Next, as shown in FIG. 8E, the masking layer 42 is removed. Further, the conductive layer 12 is formed on the second epitaxial layer 24. Next, in a way not illustrated, the top metallization 14 is formed.

The switching device described presents numerous advantages. In particular, it can be shown that the present switching device presents substantially the same electrical field as a so-called JBS trench diode; i.e., it has a value of electrical field lower than the one set up in planar JBS structures, but has a wider Schottky-contact area and thus has a wider useful area for passage of current. Furthermore, the present switching device is characterized by lower leakage currents, as well as by a forward-biasing voltage drop lower than what occurs, for example, in planar JBS structures.

Finally, it is clear that modifications and variations can be made to the device and to the manufacturing method described and illustrated herein, without thereby departing from the scope of the present disclosure.

For instance, the types of doping may be reversed with respect to what has been described herein.

As regards the manufacturing process, the order of the steps may be different from what has been described herein. In addition, the manufacturing process may include further steps other than the ones described. For instance, the manufacturing process may include, in a per se known manner, a so-called step of definition of the active area, which envisages formation of field-oxide regions (not illustrated) delimiting the area in which the JBS diode is to be obtained.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A switching device comprising:
   a body of semiconductor material, which includes a first epitaxial layer and a second epitaxial layer each having a first conductivity type, the body having a front surface;
   a contact layer of a first conductive material, which extends in contact with the front surface and forms a Schottky contact with the body; and
   a plurality of buried regions which have a second conductivity type, are arranged within the first epitaxial layer, and are spaced apart from the front surface of the body by the second epitaxial layer, the second epitaxial layer overlying, and directly contacting, the plurality of buried regions,
   wherein the plurality of buried regions includes consecutive first and second buried regions that are adjacent to one another, each of the first and second buried regions being spaced apart from the contact layer by the second epitaxial layer, and the second epitaxial layer having a substantially same thickness overlying each of the first and second buried regions, and
   wherein the second epitaxial layer is a single layer.

2. The switching device of claim 1, further comprising a plurality of connection regions of a second conductive material, which is different from the first conductive material, each connection region extending in the semiconductor body from the front surface, and contacting a corresponding buried region of the buried regions.

3. The switching device of claim 2, wherein each connection region extends at least in part into the corresponding buried region.

4. The switching device of claim 2, wherein the semiconductor body and the contact layer form a Schottky contact, and wherein each connection region forms an ohmic contact with the corresponding buried region.

5. The switching device of claim 2, wherein said second conductive material is a silicide of a transition metal.

6. The switching device of claim 2, wherein the second conductive material is a homogenous material.

7. The switching device of claim 1, wherein said first and second epitaxial layers have different doping levels with respect to each other.

8. The switching device of claim 1, further comprising a top layer of conductive material, which overlies, in direct contact, the contact layer and has a greater thickness than the contact layer.

9. The switching device of claim 1, wherein the body comprises silicon carbide.

10. A device, comprising:
    a semiconductor body having a front surface, the semiconductor body including:
      a semiconductor substrate having a first conductivity type;
      a first epitaxial layer, having the first conductivity type, positioned on the semiconductor substrate; and
      a second epitaxial layer, having the first conductivity type, positioned on the first epitaxial layer;
    a conductive layer on the second epitaxial layer;
    a first semiconductor region, having a second conductivity type different than the first conductivity type, positioned in and at a first side of the first epitaxial layer, the first semiconductor region including consecutive first and second buried regions that are laterally adjacent to one another, each of the first and second buried regions being spaced apart from the conductive layer by the second epitaxial layer, and the second epitaxial layer having a substantially same thickness overlying each of the first and second buried regions; and
    a first contact that extends from the conductive layer through the second epitaxial layer and to the first buried region the first semiconductor region,
    wherein the second epitaxial layer is a single layer.

11. The device of claim 10, wherein the first contact extends into a portion of the first semiconductor region.

12. The device of claim 10, further comprising:
    a second contact that extends from the conductive layer through the second epitaxial layer and to the second buried region,
    wherein the conductive layer electrically couples the first contact to the second contact.

13. The device of claim 12, wherein:
    the second epitaxial layer and the conductive layer form a Schottky contact;
    the first contact forms a first ohmic contact with the first buried region; and
    the second contact forms a second ohmic contact with the second buried region.

14. The device of claim 13, wherein the Schottky contact and the first ohmic contact form a Junction-barrier Schottky diode.

15. The switching device of claim 10, wherein said first and second epitaxial layers have different doping levels with respect to each other.

16. A switching device comprising:
    a semiconductor body, which includes first and second epitaxial layers having a first conductivity type, the second epitaxial layer being arranged on the first epitaxial layer and having a doping level different from a doping level of the first epitaxial layer, the semiconductor body having a front surface;
    a contact layer of a first conductive material, which extends in contact with the front surface and forms a Schottky contact with the semiconductor body;
    a plurality of buried regions which have a second conductivity type and are arranged within the first epitaxial layer, at a distance from the contact layer, the second epitaxial layer overlying and directly contacting the buried regions; and
    a plurality of connection regions of a second conductive material, which is different from the first conductive material, each connection region extending in the semiconductor body from the front surface and contacting a corresponding buried region of the plurality of buried regions and forming an ohmic contact with said corresponding buried region,
    wherein the plurality of buried regions includes consecutive first and second buried regions that are adjacent to one another, each of the first and second buried regions being spaced apart from the contact layer by the second epitaxial layer, and the second epitaxial layer having a substantially same thickness overlying each of the first and second buried regions, and
    wherein the second epitaxial layer is a single layer.

17. The switching device of claim 16, wherein each connection region extends at least in part into the corresponding buried region.

18. The switching device of claim 16, wherein said second conductive material is a silicide of a transition metal.

19. The switching device of claim 16, wherein said first conductive material is a transition metal.

20. The switching device of claim 16, wherein the body is of silicon carbide.

21. The switching device of claim 16, wherein the first conductivity type is an N type and the second conductivity type is a P type.

* * * * *